(12) United States Patent
Chae et al.

(10) Patent No.: US 7,269,068 B2
(45) Date of Patent: Sep. 11, 2007

(54) FLASH MEMORY DEVICE AND METHOD OF PROGRAMMING THE SAME

(75) Inventors: Dong-Hyuk Chae, Seoul (KR); Dae-Seok Byeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 141 days.

(21) Appl. No.: 11/205,245

(22) Filed: Aug. 16, 2005

(65) Prior Publication Data
US 2006/0092703 A1  May 4, 2006

(30) Foreign Application Priority Data
Oct. 28, 2004  (KR) ...................... 10-2004-0086669

(51) Int. Cl.
*G11C 16/12* (2006.01)
*G11C 16/06* (2006.01)
*G11C 16/00* (2006.01)

(52) U.S. Cl. .......................... 365/185.18; 365/185.17; 365/185.19

(58) Field of Classification Search ........... 365/185.17, 365/185.18, 185.19
See application file for complete search history.

(56) References Cited

U.S. PATENT DOCUMENTS

| | | | | |
|---|---|---|---|---|
| 5,473,563 A | * | 12/1995 | Suh et al. | ............... 365/185.13 |
| 5,642,309 A | * | 6/1997 | Kim et al. | ............. 365/185.22 |
| 6,259,624 B1 | * | 7/2001 | Nobukata | ............... 365/185.03 |
| 6,266,270 B1 | * | 7/2001 | Nobukata | ............... 365/185.03 |
| 6,353,555 B1 | * | 3/2002 | Jeong | ..................... 365/185.11 |
| 6,469,933 B2 | * | 10/2002 | Choi et al. | ............. 365/185.17 |
| 6,504,757 B1 | | 1/2003 | Hollmer et al. | |
| 6,845,060 B2 | * | 1/2005 | Lee | ............................. 365/236 |
| 2004/0080980 A1 | * | 4/2004 | Lee | ........................ 365/185.17 |

FOREIGN PATENT DOCUMENTS

| | | |
|---|---|---|
| JP | 2000-048581 | 2/2000 |
| JP | 2000-048584 | 2/2000 |
| JP | 2000-251485 | 9/2000 |

* cited by examiner

*Primary Examiner*—J. H. Hur
(74) *Attorney, Agent, or Firm*—Myers Bigel Sibley & Sajovec PA

(57) ABSTRACT

Flash memory devices include a memory array having a plurality of NAND strings of EEPROM cells therein. A word line driver is provided to improve programming efficiency. The word line driver is electrically coupled to the memory array by a plurality of word lines. The word line driver includes a plurality of pass voltage switches. These switches have outputs electrically coupled by diodes to the plurality of word lines. Methods of programming flash memory devices include applying a pass voltage to a plurality of unselected word lines in a non-volatile memory array while simultaneously applying a sequentially ramped program voltage to a selected word line in the non-volatile memory array. The sequentially ramped program voltage has a minimum value that is clamped by a word line driver to a level not less than a value of the pass voltage.

9 Claims, 7 Drawing Sheets

FLASH MEMORY DEVICE AND METHOD OF PROGRAMMING THE SAME

REFERENCE TO PRIORITY APPLICATION

This application claims priority to Korean Patent Application No. 2004-86669 filed Oct. 28, 2004, the disclosure of which is hereby incorporated herein by reference.

FIELD OF THE INVENTION

The present invention relates to integrated circuit memory devices and methods of programming same and, more particularly, to nonvolatile memory devices and methods of programming nonvolatile memory devices.

BACKGROUND OF THE INVENTION

Nonvolatile memory devices keep data stored therein even if a power source is disconnected thereto. Among nonvolatile memories, a flash memory has a function of electrically and collectively erasing data of cells. Therefore, flash memories are widely used for computers and memory cards. The flash memory is divided into a NOR flash memory and a NAND flash memory in accordance with the connection state between cells and bit lines. In general, since the NOR flash memory has large current consumption, the NOR flash memory is disadvantageous to high integration but can support high speed operation. Since the NAND flash memory uses smaller cell current than the NOR flash memory, the NAND flash memory is advantageous to high integration.

The NAND flash memory includes a memory cell array as a storage region for storing information. The memory cell array consists of a plurality of blocks and each block consists of a plurality of cell strings (also referred to as NAND strings). A page buffer circuit is provided in the flash memory in order to store data in the memory cell array or to read data from the memory cell array. As well known, the memory cells of the NAND flash memory are erased or programmed using Fowler-Nordheim tunneling current. Methods of erasing and programming a NAND flash electrically erasable and programmable read only memory (EEPROM) are disclosed in U.S. Pat. No. 5,473,563 entitled "Nonvolatile Semiconductor Memory" and in U.S. Pat. No. 5,696,717 entitled "Nonvolatile Integrated Circuit Memory Devices Having Adjustable Erase/Program Threshold Voltage Verification Capability".

FIG. 1 illustrates changes in a wordline voltage according to a common programming method. Referring to FIG. 1, in order to correctly control the value of threshold voltages of flash memory cells, the flash memory cells are programmed by an incremental step pulse programming (ISPP) method. A circuit for generating a program voltage in accordance with the ISPP method is disclosed in U.S. Pat. No. 5,642,309, entitled "Auto-Program Circuit in a Nonvolatile Semiconductor Memory Device". A program voltage Vpgm in accordance with the ISPP programming method sequentially increases as program loops of a program cycle are repeated, as illustrated in FIG. 1. Each program loop consists of a program period and a program verification period as is well known. The program voltage Vpgm increases by a predetermined increment ΔVpgm and program time is maintained uniform with respect to the program loops.

However, when a sharply increased program voltage Vpgm is generated in the respective program steps, coupling noise increases. This sharply increased program voltage Vpgm is characterized by very large ΔV/Δt variations. The coupling noise also typically increases as the integration density of a memory device increases and the distance between adjacent signal lines is reduced (i.e., as the capacitance coupling increases between adjacent signal lines, such as adjacent wordlines, adjacent string selection lines (SSL), or adjacent ground selection transistors (GST)). In order to solve these problems, the flash memory device may generate a sequentially increased program voltage Vpgm_ramp using a high voltage ramping circuit instead of generating the sharply increased program voltage Vpgm.

FIG. 2 illustrates change in a wordline voltage when a program inhibit method using a self-boosting scheme is applied. Referring to FIG. 2, according to the program inhibit method using the self-boosting scheme, blocks to be programmed are first selected and then, a pass voltage Vpass is applied to all the wordlines of the selected blocks. All the memory cells included in the blocks are precharged to a predetermined level by the pass voltage Vpass applied to the wordlines. Then, the sequentially increased program voltage Vpgm_ramp is applied to the wordline of the cell to be programmed among the memory cells. At this time, the applied program voltage Vpgm_ramp is sequentially generated in accordance with the ISPP scheme illustrated in FIG. 1. The program voltage (Target Vpgm) that is targeted during each step of ISPP sequentially increases in the form of steps by the high voltage ramping circuit.

FIG. 2 illustrates a case in which the level of the targeted program voltage (Target Vpgm) is 14V and a case in which the level of the targeted program voltage (Target Vpgm) is 20V, respectively. Each of the targeted program voltages is generated by five ramping steps. The level of the ramped program voltage Vpgm_ramp is preferably higher than the pass voltage Vpass applied to the wordlines. However, as illustrated in FIG. 2, as the level of the targeted program voltage (Target Vpgm) is reduced, the level of the ramped program voltage Vpgm_ramp becomes lower than the level of the pass voltage Vpass (refer to the portion marked with a dotted circle of FIG. 2). Such a problem occurs since the step of the high voltage ramping circuit performing ramping is fixed even when the level of the targeted program voltage Target Vpgm is low. When the level of the ramped program voltage is lower than the level of the pass voltage Vpass, the boosting efficiency deteriorates and the reliability of programming deteriorates.

SUMMARY OF THE INVENTION

Embodiments of the present invention include methods of programming a non-volatile memory array by applying a pass voltage to a plurality of unselected word lines in the non-volatile memory array while simultaneously applying a sequentially ramped program voltage to a selected word line in the non-volatile memory array. This sequentially ramped voltage has a minimum value that is clamped by a word line driver to a level not less than a value of the pass voltage. According to further aspects of these embodiments, the step of applying a pass voltage to a plurality of unselected word lines includes reducing an elevated pass voltage by an amount equal to a threshold voltage of a MOS transistor. Moreover, the step of applying a sequentially ramped program voltage to a selected word line includes generating a sequentially ramped program voltage using an incremental step pulse programming (ISPP) method.

Still further embodiments of the present invention include a flash memory device. This flash memory device includes a memory array having a plurality of NAND strings of EEPROM cells therein. A word line driver is also provided. This word line driver is electrically coupled to the memory array by a plurality of word lines. The word line driver includes a plurality of pass voltage switches having output coupled by diodes to the plurality of word lines. The word line driver further includes a plurality of program voltage switches having outputs electrically coupled to the plurality of word lines and cathodes of the diodes.

BACKGROUND OF THE INVENTION

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
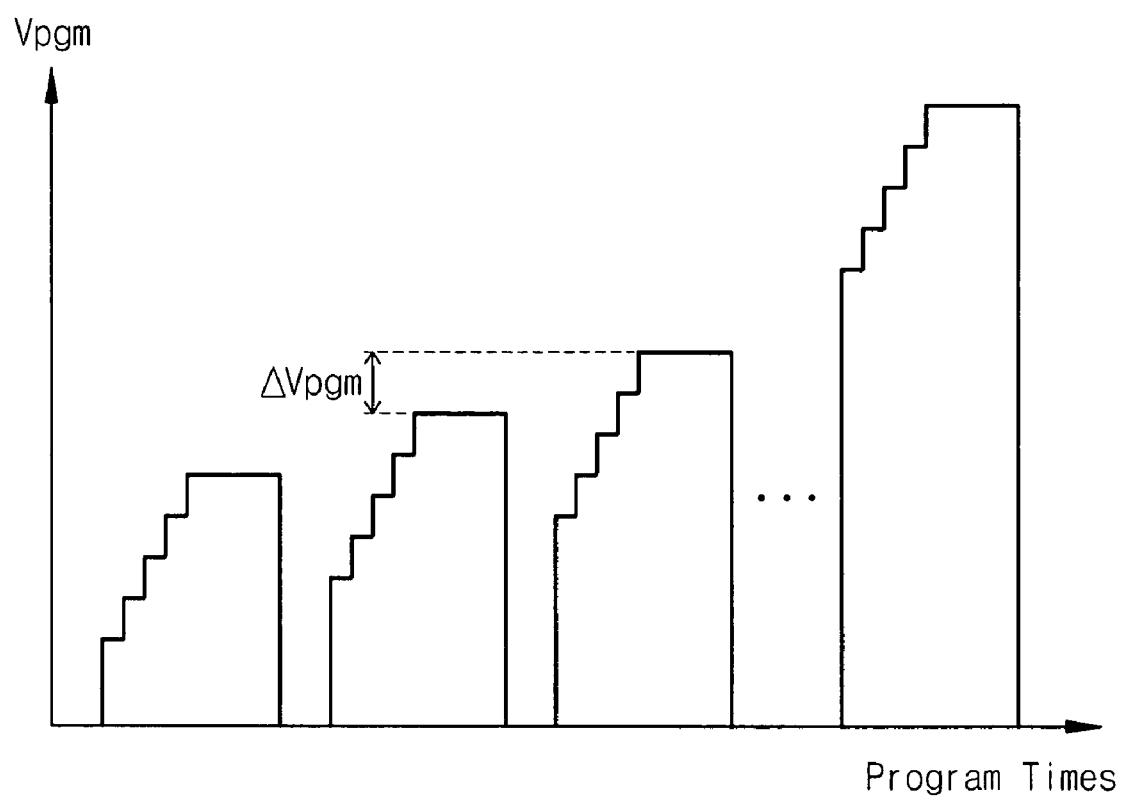
FIG. 1 illustrates change in a wordline voltage in accordance with a common programming method.
Figure 2:
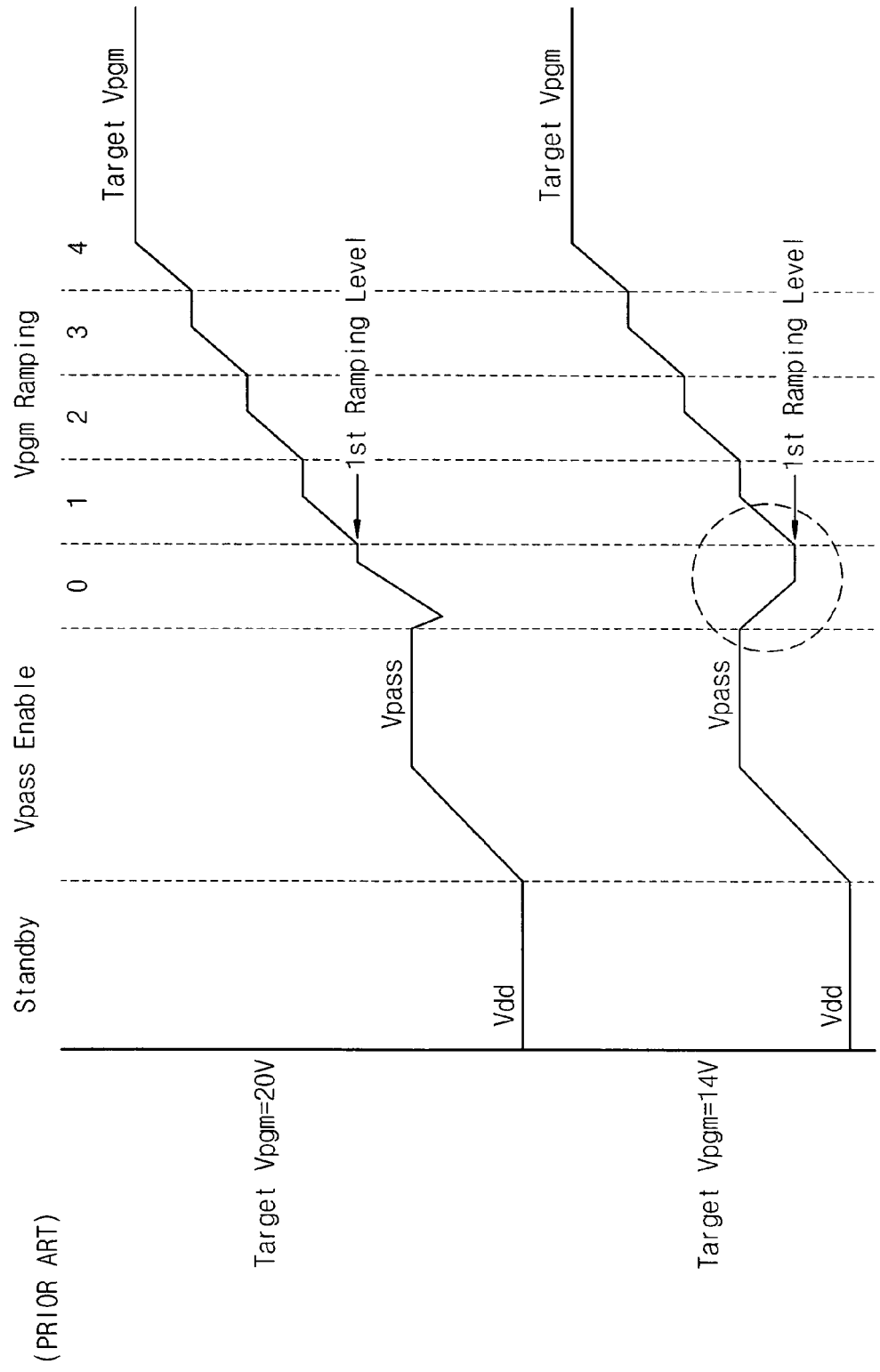
FIG. 2 illustrates change in a wordline voltage in accordance with the level of the wordline voltage that is targeted during programming.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

According to a flash memory device and a method of programming the same of the present invention, a pass voltage Vpass is applied to all the wordlines of blocks to be programmed to precharge the wordlines and then, a sequentially increased program voltage Vpgm_ramp is applied to the wordline of the cell to be programmed such that programming is performed. According to the present invention, in applying the program voltage Vpgm_ramp, when the level of the program voltage Vpgm_ramp is lower than the level of the pass voltage Vpass, the pass voltage Vpass is applied to the selected wordline instead of the program voltage Vpgm_ramp. When the level of the program voltage Vpgm_ramp is higher than the pass voltage Vpass, the program voltage Vpgm_ramp is applied to the selected wordline. As a result, the level of the program voltage Vpgm_ramp applied to the selected wordline is temporarily lower than the level of the pass voltage Vpass such that it is possible to improve boosting efficiency and to improve reliability of programming.

Figure 3:
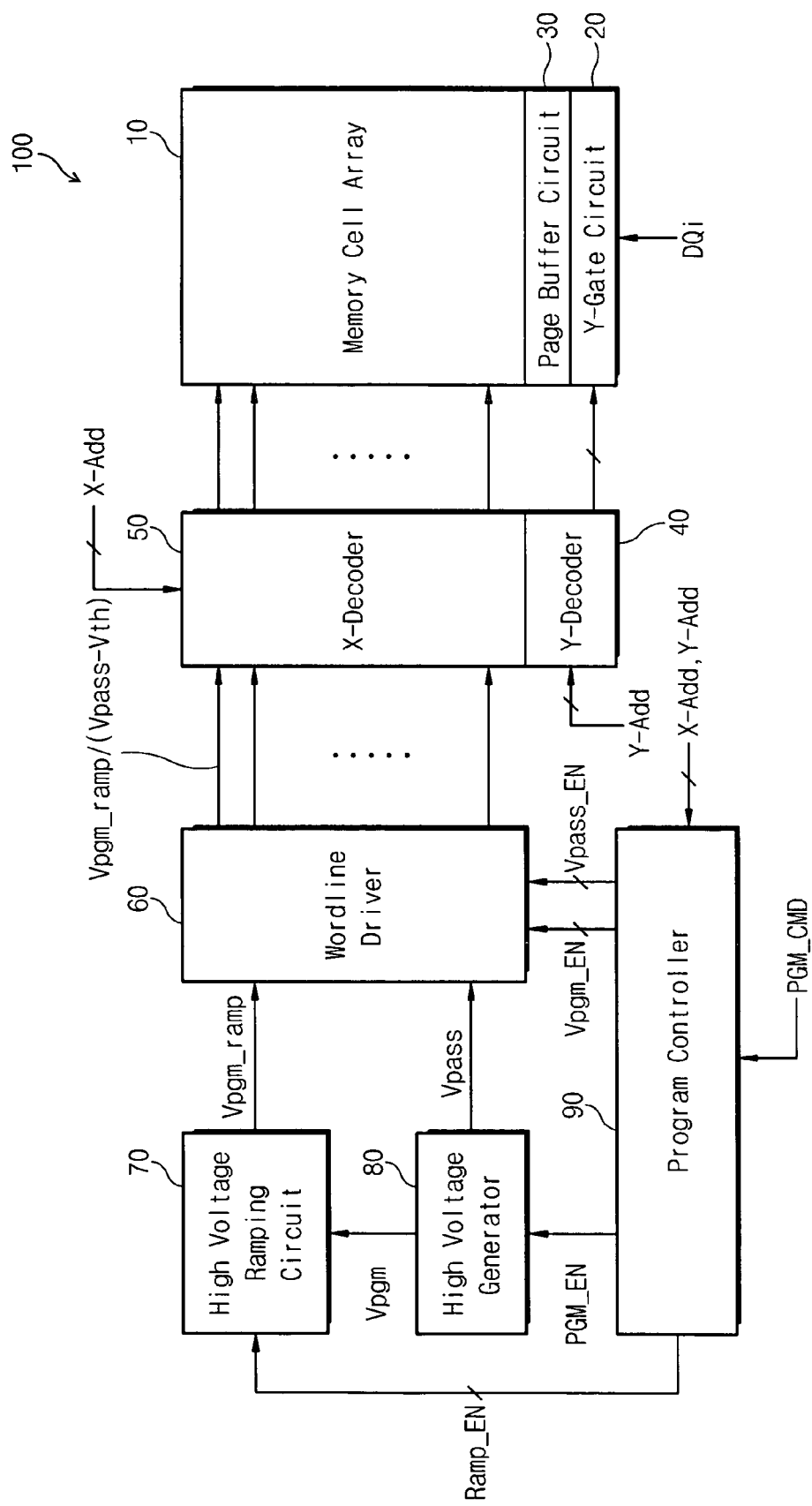
FIG. 3 is a block diagram of a flash memory device according to a preferred embodiment of the present invention.

FIG. 3 is a block diagram of a flash memory device 100 according to a preferred embodiment of the present invention. The flash memory device 100 illustrated in FIG. 3 is a NAND flash memory device. In FIG. 3, only one array block among a plurality of array blocks included in the flash memory device 100 and peripheral circuits (in particular, peripheral circuits related to programming) related to the array block are illustrated. Referring to FIG. 3, the flash memory device 100 according to an embodiment of the present invention includes a memory cell array 10, a Y-gate circuit 20, a page buffer circuit 30, a Y-decoder 40, an X-decoder 50, a wordline driver 60, a high voltage ramping circuit 70, a high voltage generator 80, and a program controller 90.

The memory cell array 10 consists of a plurality of memory blocks. Pluralities of bit lines BL1-BLm are arranged in parallel in each of a plurality of memory blocks. Pluralities of strings corresponding to the bit lines BL1 to BLm are included in each of the memory blocks. The structure of the strings included in each of the memory blocks will be described in detail with reference to FIG. 4.

The page buffer circuit 30 is connected to the memory cell array 10 through the plurality of bit lines. Pluralities of page buffers are included in the page buffer circuit 30. The Y-gate 20 and the Y-decoder 40 select a part of the plurality of buffers included in the page buffer circuit 30 in response to a Y-address (Y_Add) input from the outside. Data to be programmed is stored in the selected page buffers. The data DQi is transmitted to the corresponding page buffer through the Y-gate 20.

On the other hand, the high voltage generator 80 is a high voltage pumping circuit that consists of transistors (not shown) and a pumping capacitor (not shown). The high voltage generator 80 generates a high voltage Vpgm to be used for programming and a pass voltage Vpass in response to a program activation signal PGM_EN generated by the program controller 90. The high voltage Vpgm generated by the high voltage generator 80 is applied to the high voltage ramping circuit 70 and the pass voltage Vpass is applied directly to the wordline driver 60.

The high voltage ramping circuit 70 generates a sequentially increased program voltage Vpgm_ramp in the form of steps in response to a ramp activation signal Ramp_EN generated by the controlling portion 90 and the high voltage Vpgm generated by the high voltage generator 80. The high voltage ramping circuit 70 consists of a circuit for sequentially distributing the high voltage Vpgm using a plurality of serially connected diodes. As a result, the high voltage ramping circuit 70 generates a program voltage Vpgm_ramp having a voltage level sequentially increased by the threshold voltage Vth of the diodes. The function of sequentially generating a high program voltage is referred to as ramping. The program voltage Vpgm_ramp generated by the high voltage ramping circuit 70 is applied to the wordline of a cell to be programmed through the wordline driver 60.

The wordline driver 60 receives the program voltage Vpgm_ramp from the high voltage ramping circuit 70 and receives the pass voltage Vpass from the high voltage generator 80. The wordline driver 60 selectively provides the program voltage Vpgm_ramp and the pass voltage Vpass to the X-decoder 50 in response to enable signals Vpgm_EN and Vpass_EN generated by the program controller logic 90. At this time, the pass voltage output from the wordline driver 60 has a voltage level of Vpass−Vth when the level of the pass voltage Vpass generated by the high voltage generator 80 is Vpass. Reduction in a voltage by Vth is caused by the threshold voltage Vth of the diodes included in the wordline driver 60 (see, e.g., FIG. 5).

The X-decoder 50 selects the wordline of the cell to be programmed in response to the X-address (X_Add) input from the outside. The X-decoder 50 applies the program voltage Vpgm_ramp or the pass voltage (Vpass−Vth) transmitted from the wordline driver 60 to the selected wordline. Such a series of operations are performed by the control of the program controller 90. The program controller 90 controls an operation of programming the flash memory device 100 in response to a program command PGM_CMD and address information (X_Add and Y_Add) input from the outside. The program controller 90 controls the high voltage generating operation of the high voltage generator 80 such that a target program voltage (Target Vpgm) is generated by the program loop in accordance with an incremental step pulse programming (ISPP) method. In order to inhibit a coupling phenomenon from occurring between adjacent signal lines, the rising slope of the program voltage generated by the program loop is controlled. In particular, the program controller 90 controls the ramping operation of the high voltage ramping circuit 70. The high voltage ramping circuit 70 generates the program voltage Vpgm_ramp that increases in the form of steps in response to the ramping activation signal Ramp_EN generated by the program controller 90. Also, the program controller 90 controls application of a voltage to wordlines in accordance with a self-boosting scheme such that undesired cells are not programmed among the memory cells connected to the same wordline during programming. In order to apply a voltage to wordlines, the program controller 90 controls application of the pass voltage Vpass to all the wordlines of the selected blocks for programming such that the wordlines are precharged. Then, the program voltage Vpgm_ramp is applied to the wordline of the cell to be programmed. The structure of a memory cell array to be programmed will be described as follows.

Figure 4:
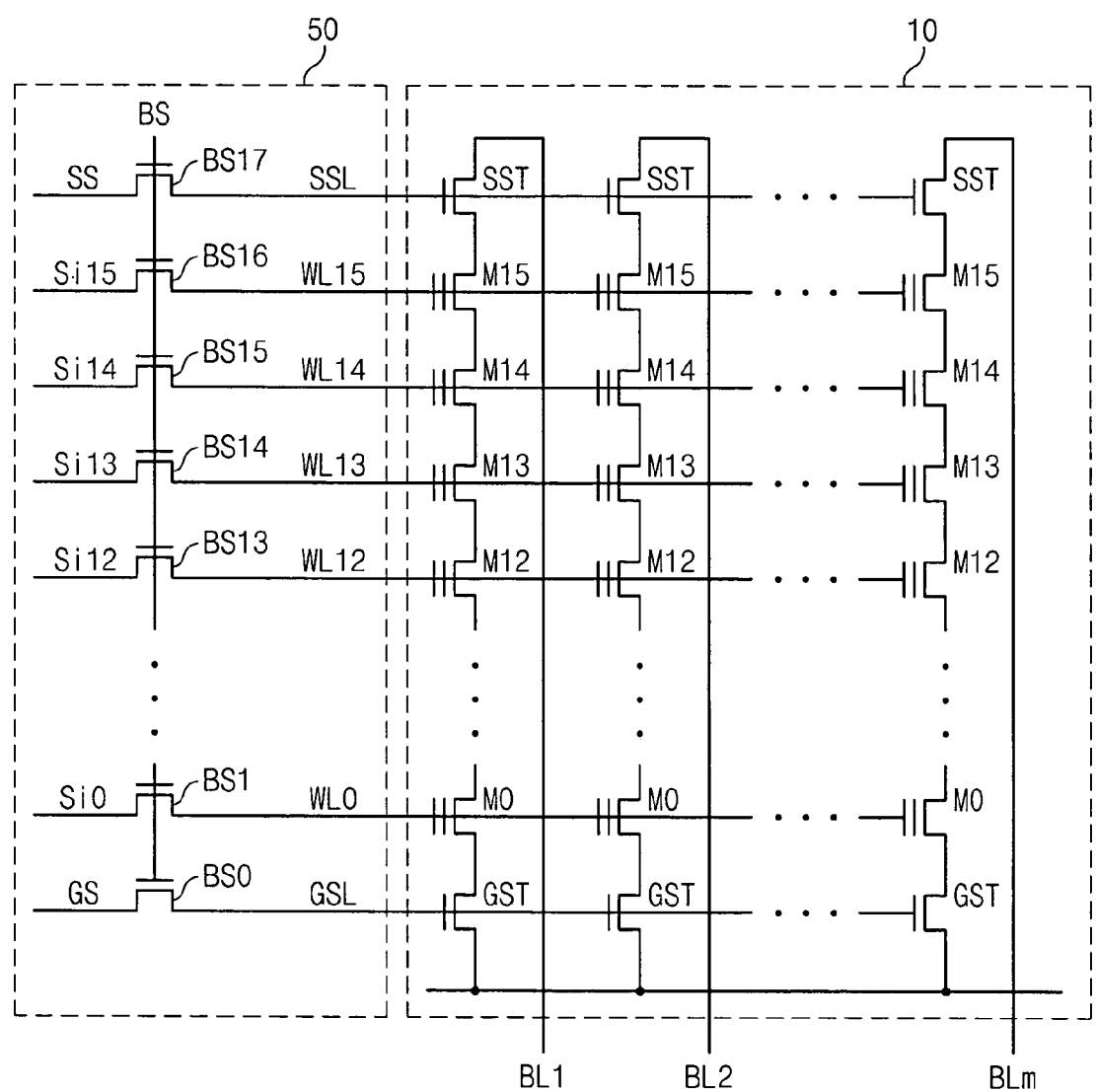
FIG. 4 is a circuit diagram of the memory cell array illustrated in FIG. 3.

FIG. 4 is a circuit diagram of the memory cell array 10 illustrated in FIG. 3. Referring to FIG. 4, the memory cell array 10 consists of a plurality of memory blocks. Pluralities of bit lines BL1 to BLm are arranged in parallel in each of the memory blocks. Pluralities of strings corresponding to the plurality of bit lines BL1 to BLm are included in each of the memory blocks.

As illustrated in FIG. 4, each NAND string consists of a string selection transistor SST, a ground selection transistor GST, and a plurality of flash electrically erasable and programmable read only memory (EEPROM) cell transistors (for example, 16 flash EEPROM cell transistors M15 to M0), which are serially connected between the source of the string selection transistor SST and the drain of the ground selection transistor GST. In FIG. 4, each string consists of 16 flash EEPROM cell transistors M15 to M0, which is only an example. The number of flash EEPROM cell transistors that constitute the string can be modified.

The drain of the string selection transistor SST of each string is connected to the corresponding bit line. The source of the ground selection transistor GST of each string is connected to a common source line CSL. The gates of the string selection transistors SST in the respective strings are commonly connected to a string selection line SSL. The gates of the ground selection transistors GST are commonly connected to a ground selection line GSL. The control gates of the flash EEPROM cell transistors of the respective strings are commonly connected to the corresponding wordlines among the wordlines WL0 to WL15. The respective bit lines BL1 to BLm are electrically connected to the corresponding page buffers (not shown) included in the page buffer circuit 30 illustrated in FIG. 3.

The ground selection line GSL, the wordlines WL0 to WL15, and the string selection line SSL are connected to corresponding selection signal lines GS, Si0 to Si15, and SS through corresponding block selection transistors BS0 to BL17. The block selection transistors BS0 to BS17 are included in the X-decoder 50 of FIG. 3 and are connected such that the block selection transistors BS0 to BS17 are commonly controlled by a block selection control signal BS.

The selection signal lines GS, Si0 to Si15, and SS are driven by voltages required by the corresponding selection circuits (or driving circuits) when the program operation is performed. Here, the selected block selection control signal BS has a high voltage level such that the program voltage Vpgm_ramp or the pass voltage Vpass transmitted through the selection signal lines Si0 to Si15 is sufficiently transmitted to the corresponding wordlines WL0 to WL15. The structure of the wordline driver 60 that outputs a signal (that is, the program voltage Vpgm_ramp or the pass voltage Vpass) transmitted to the wordlines WL0 to WL15 to the signal lines Si0 to Si15 is as follows.

Figure 5:
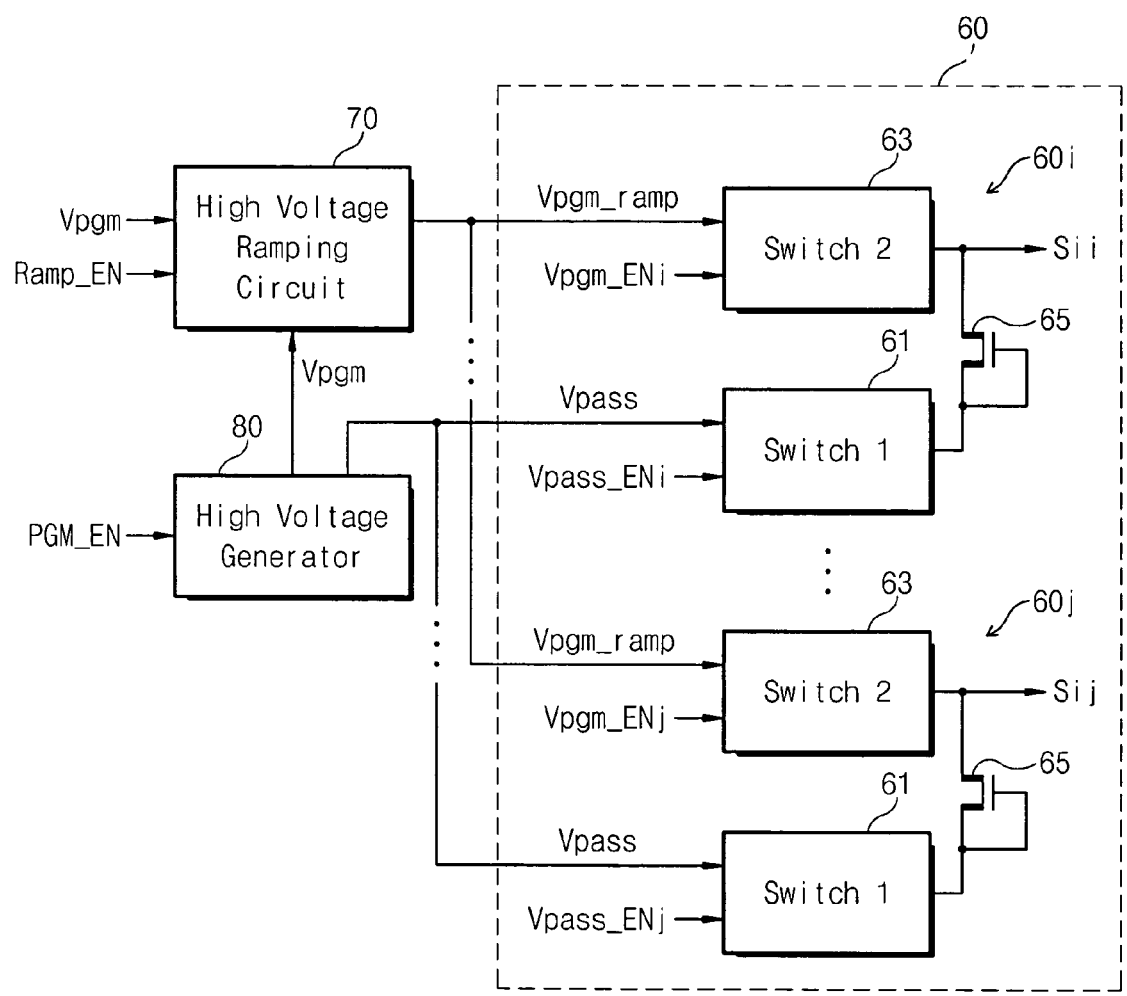
FIG. 5 is a detailed block diagram of the wordline driver illustrated in FIG. 3.

FIG. 5 is a detailed block diagram of the wordline driver 60 illustrated in FIG. 3. Referring to FIG. 5, the wordline driver 60 includes a plurality of wordline drivers 60*i* to 60*j* that selectively apply the program voltage Vpgm_ramp or the pass voltage (Vpass−Vth) to selection signal lines Sii to Sij corresponding to the respective wordlines of the selected blocks. Each of the wordline drivers 60*i* to 60*j* includes a first switch 61 for controlling the output of the pass voltage Vpass, a second switch 63 for controlling the output of the program voltage Vpgm_ramp, and a voltage compensating portion 65 for compensating for the level of the program voltage Vpgm_ramp such that the level of the output program voltage Vpgm_ramp is always higher than the level of the pass voltage Vpass.

The first switch 61 outputs the pass voltage (Vpass−Vth) to the corresponding selection signal lines Sii to Sij in response to the pass voltage enable signal Vpass_EN generated by the controlling logic 90. The second switch 63 outputs the program voltage Vpgm_ramp to the corresponding selection signal lines Sii to Sij in response to the program voltage enable signal Vpgm_EN generated by the controlling logic 90. The voltage compensating portion 65 is connected between the output port of the first switch 61 and the output port of the second switch 63. The voltage corresponding portion 65 consists of a diode having a predetermined threshold voltage value Vth and is connected between the first switch 61 and the second switch 63 to have a forward direction current path. When the first switch 61 is turned on in order to apply the pass voltage Vpass to the wordline of the selected block, the voltage compensating portion 65 reduces the pass voltage Vpass output from the first switch 61 by the predetermined threshold voltage value Vth. The pass voltage Vpass reduced by the voltage compensating portion 65 by a predetermined level (i.e., Vth) is output to the corresponding selection signal lines Sii to Sij. Subsequently, the second switch 63 is turned on in order to apply the program voltage Vpgm_ramp to the selected wordline. The voltage compensating portion 65 selects one of the voltages Vpass and Vpgm_ramp in accordance to the levels of the voltages Vpass and Vpgm_ramp output from the first switch 61 and the second switch 63 and outputs the selected voltage to the corresponding selection signal lines Sii to Sij. In such a case, the first and second switches 61 and 63 are turned on and the actual operation of selecting the voltages Vpass and Vpgm_ramp is performed by the voltage compensating portion 65. When the second switch 63 is turned on in order to apply the program voltage Vpgm_ramp, the switching operation performed by the voltage compensating portion 65 is as follows.

For example, when the level of the program voltage Vpgm_ramp output by the second switch 63 is lower than the level of the pass voltage Vpass (to be more specific, when the level of the program voltage Vpgm_ramp is lower than the pass voltage Vpass–the voltage reduction amount Vth), the voltage compensating portion 65 reduces the pass voltage Vpass by the threshold voltage value Vth to output the reduced pass voltage Vpass. When the level of the program voltage Vpgm_ramp output by the second switch 63 is higher than the level of the pass voltage Vpass (to be more specific, when the level of the program voltage Vpgm_ramp is higher than the pass voltage Vpass–the voltage reduction amount Vth), the voltage compensating portion 65 is shut off. As a result, the program voltage Vpgm_ramp output by the second switch 63 is directly provided to the corresponding selection signal lines Sii to Sij. Due to the operation characteristic of the voltage compensating portion 65, the level of the program voltage Vpgm_ramp provided to the selection signal lines Sii to Sij is always higher than the level of the pass voltage Vpass.

At this time, since the first and second switches 61 and 63 are turned on, even if the level of the program voltage Vpgm to be applied to the wordlines is temporarily lower than the level of the pass voltage Vpass due to certain reasons, an output path is changed such that the reduced pass voltage (Vpass–Vth) can be immediately provided instead of the reduced program voltage Vpgm.

Figure 6:
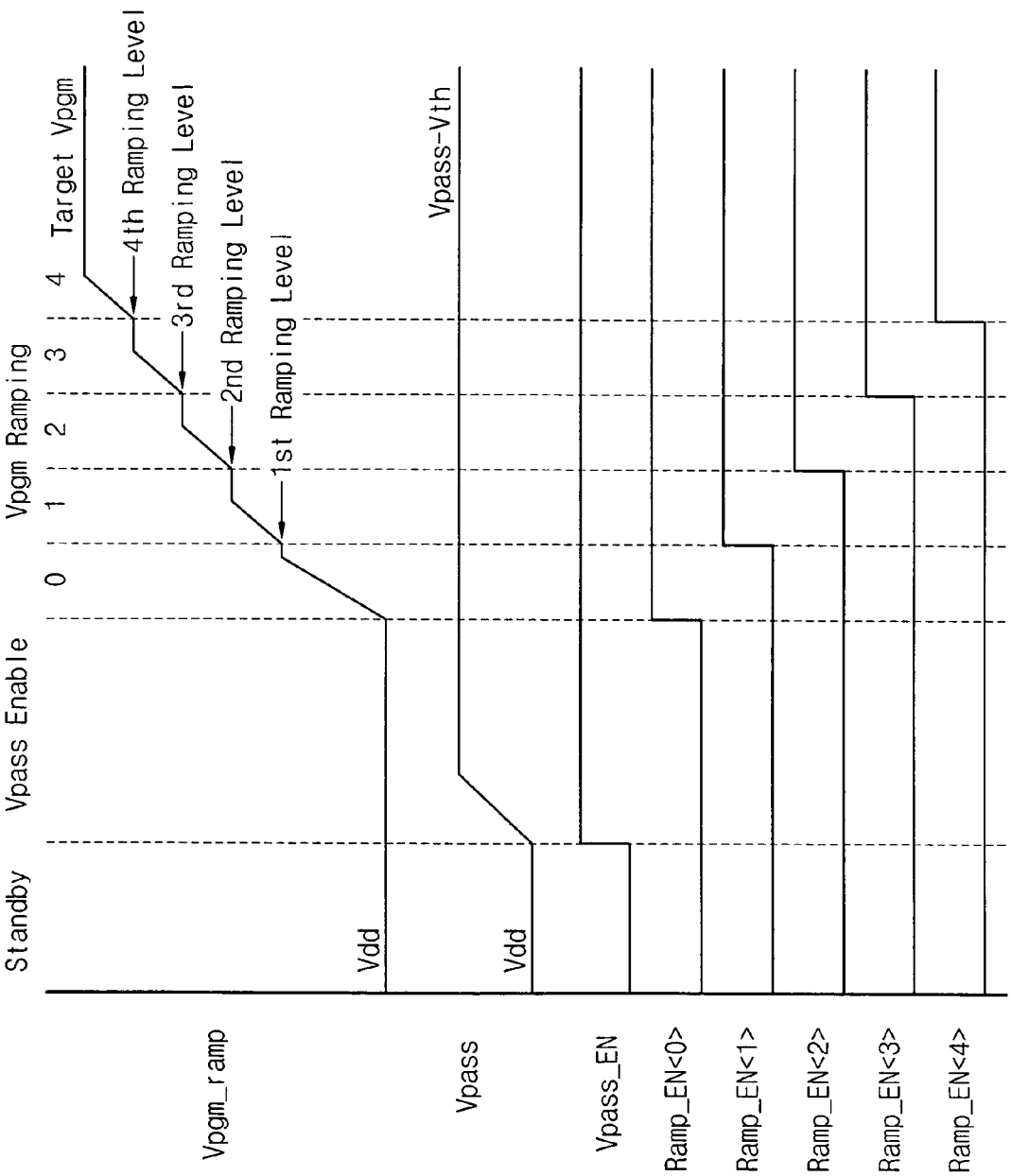
FIG. 6 is a timing diagram illustrating the respective control signals and a high voltage during programming according to the present invention.
Figure 7:
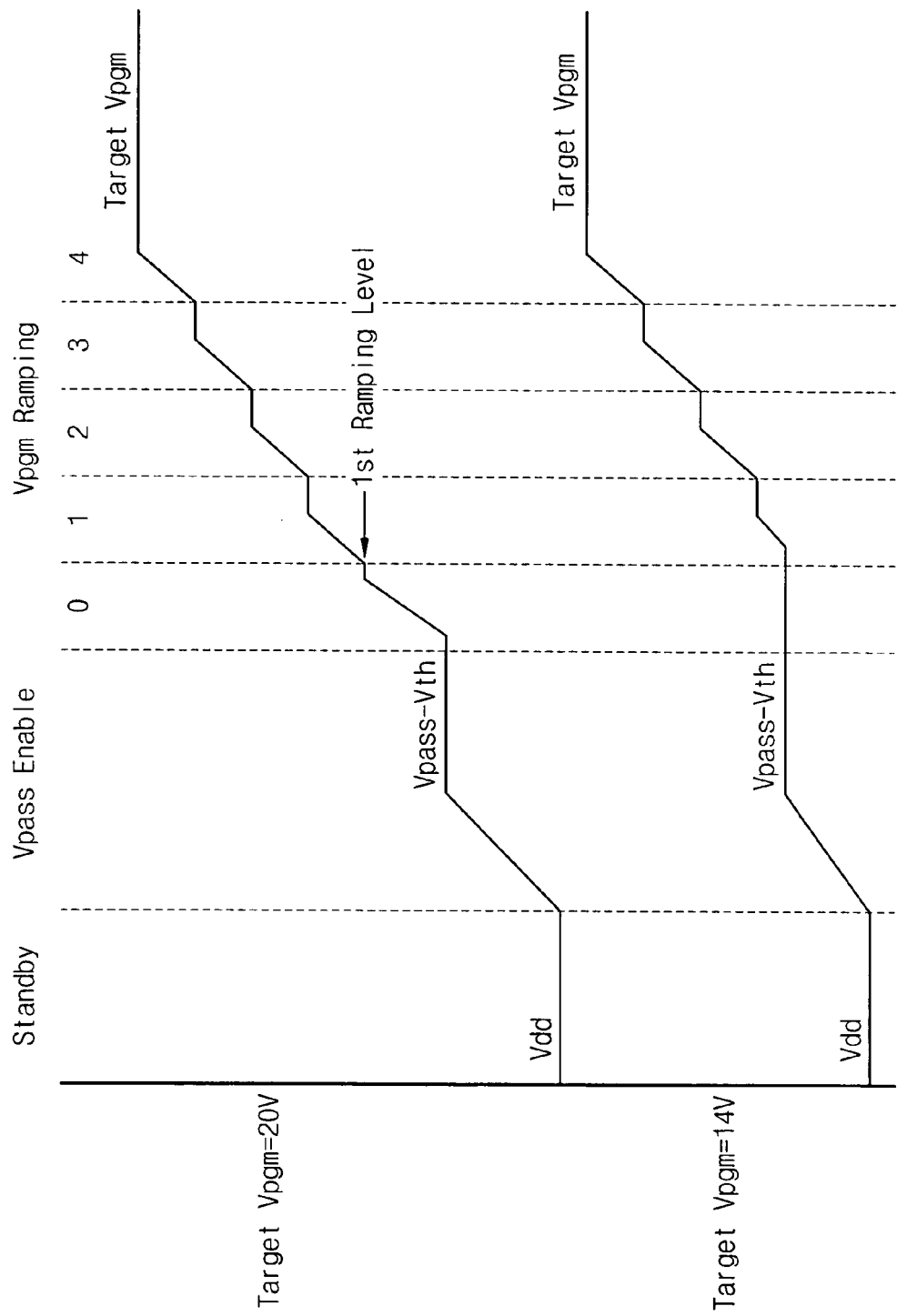
FIG. 7 illustrates change in a wordline voltage in accordance with a targeted wordline voltage level during programming according to the present invention.

FIG. 6 is a timing diagram of the respective control signals and the high voltage during programming according to the present invention. FIG. 7 illustrates change in the wordline voltage according to the targeted level of the wordline voltage during programming according to the present invention. Referring to FIGS. 6 and 7, the pass voltage Vpass is applied to all the wordlines of blocks to be programmed in response to the previously activated pass voltage enable signal Vpass_EN. At this time, the level of the applied pass voltage Vpass is preferably the voltage level of Vpass–Vth. Reduction in the pass voltage Vpass by Vth is determined by the magnitude of the threshold voltage of the diode that constitutes the voltage compensating portion 65. After all the wordlines of the selected blocks are precharged by the pass voltage Vpass provided during a predetermined period, the high voltage ramping circuit 70 sequentially generates the ramped program voltage Vpgm_ramp in response to ramp activation signals Ramp_EN<0> to Ramp_EN<4> generated by the controlling portion 90. At this time, the ramped program voltage Vpgm_ramp is provided to the corresponding selection signal lines Sii to Sij in response to the program voltage enable signal Vpgm_EN generated by the controlling logic 90.

According to the present invention, the level of the pass voltage Vpass applied to the wordlines is the voltage level of Vpass–Vth due to reduction in the voltage caused by the voltage compensating portion 65, which is an example. For example, the pass voltage Vpass having the voltage level of Vpass+Vth may be generated by the high voltage generator 80 considering reduction in the voltage caused by the voltage compensating portion 65 such that the pass voltage Vpass having the voltage level of Vpass is applied to the wordlines. Also, it is possible to control the width of reduction in the voltage caused by the voltage compensating portion 65.

As described above, the level of the program voltage Vpgm_ramp provided by the wordline drivers 60i to 60j is always higher than the level of the pass voltage Vpass due to the voltage compensation function of the voltage compensating portion 65. As a result, it is possible to prevent the level of the program voltage Vpgm_ramp applied to the selected wordline from being temporarily lower than the level of the pass voltage Vpass such that it is possible to improve boosting efficiency and to improve reliability of programming. According to the present invention, it is possible to prevent the level of the program voltage applied to the selected wordline from being temporarily lower than the level of the pass voltage such that it is possible to improve boosting efficiency and to improve the reliability of programming.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A flash memory device, comprising:
   a memory cell array having a plurality of memory cells therein;
   a program controller for controlling the programming of the memory cells;
   a high voltage generating portion for generating a pass voltage and a program voltage by the control of the program controller; and
   a wordline driver for outputting either the pass voltage or the program voltage to the corresponding wordline of the memory cell array by the control of the program controller;
   wherein the wordline driver comprises:
   a first switch for outputting the pass voltage in response to a pass voltage activation signal input from the program controller;
   a second switch for outputting the program voltage to the wordlines in response to a program voltage activation signal input from the program controller; and
   a voltage compensating portion for controlling the output of the program voltage such that the level of the program voltage is always higher than the level of the pass voltage.

2. The flash memory device as set forth in claim 1, wherein the high voltage generating portion comprises:
   a high voltage generator for generating the pass voltage and the program voltage by the control of the program controller; and
   a high voltage ramping circuit for sequentially increasing the program voltage generated by the high voltage generator.

3. The flash memory device as set forth in claim 1, wherein the program voltage is generated by an incremental step pulse programming (ISPP) method in which the program voltage sequentially increases by program loop.

4. The flash memory device as set forth in claim 1, wherein the voltage compensating portion comprises a diode connected between the output port of the first switch and the output port of the second switch.

5. The flash memory device as set forth in claim 1, wherein the voltage compensating portion reduces the pass voltage output from the first switch by a predetermined threshold voltage to output the reduced pass voltage to the wordlines.

6. The flash memory device as set forth in claim 5, wherein, when the program voltage activation signal is input, the voltage compensating portion outputs the reduced pass voltage instead of the program voltage if the level of the program voltage output from the second switch is lower than the level of the reduced pass voltage.

7. The flash memory device as set forth in claim 5, wherein, when the program voltage activation signal is input, the voltage compensating portion is shut off to intercept supply of the reduced pass voltage if the level of the program voltage output from the second switch is higher than the level of the reduced pass voltage.

8. A flash memory device, comprising:
   a memory cell array;
   a program controller;
   a voltage generator configured to generate pass and program voltages, in response to a program enable signal generated by said program controller;
   a ramping circuit configured to generate a ramped program voltage in response to the program voltage and a ramp enable signal generated by said program controller; and
   a wordline driver responsive to the ramped program voltage and the pass voltage, said wordline driver configured to output either the pass voltage or the ramped program voltage to a wordline in said memory cell array, in response to signals generated by said program controller, said wordline driver comprising a voltage compensating portion configured to maintain the outputted ramped program voltage at a level higher than a level of the outputted pass voltage.

9. The flash memory device of claim 8, wherein the voltage compensating portion comprises a diode.

* * * * *